US007934309B2

(12) United States Patent
Kawamori et al.

(10) Patent No.: US 7,934,309 B2
(45) Date of Patent: May 3, 2011

(54) METHODS OF FABRICATING EXCHANGE-COUPLING FILM, MAGNETORESISTIVE ELEMENT, AND THIN-FILM MAGNETIC HEAD

(75) Inventors: Keita Kawamori, Tokyo (JP); Satoshi Miura, Tokyo (JP)

(73) Assignee: TDK Corporation, Tokyo (JP)

( * ) Notice: Subject to any disclaimer, the term of this patent is extended or adjusted under 35 U.S.C. 154(b) by 602 days.

(21) Appl. No.: 12/003,453

(22) Filed: Dec. 26, 2007

(65) Prior Publication Data

US 2009/0165894 A1 Jul. 2, 2009

(51) Int. Cl.
*G11B 5/127* (2006.01)

(52) U.S. Cl. ................ 29/603.13; 29/603.07; 29/603.08

(58) Field of Classification Search ........................ None
See application file for complete search history.

(56) References Cited

U.S. PATENT DOCUMENTS 5,852,531 A 12/1998 Yamada
6,255,814 B1 7/2001 Shimazawa et al.
6,301,088 B1 10/2001 Nakada
2004/0047088 A1* 3/2004 Hasegawa ................ 360/324.12
2004/0072020 A1* 4/2004 Hasegawa et al. ............ 428/692
2006/0226940 A1* 10/2006 Lee et al. ...................... 335/216

FOREIGN PATENT DOCUMENTS

JP A 10-97709 4/1998
JP A 11-296823 10/1999
JP A 2000-57540 2/2000
JP A 2005-333106 12/2005

* cited by examiner

*Primary Examiner* — John P Sheehan
(74) *Attorney, Agent, or Firm* — Oliff & Berridge, PLC

(57) ABSTRACT

The method of fabricating an exchange-coupling film in accordance with the present invention comprises a multilayer body forming step of forming a multilayer body having an antiferromagnetic layer and a ferromagnetic layer laminated on the antiferromagnetic layer; and an annealing step of annealing the multilayer body in a magnetic field with a maximum temperature higher than a blocking temperature of the multilayer body by 15 to 60° C.

3 Claims, 17 Drawing Sheets

| | Ta - Tb (°C) | | | | |
|---|---|---|---|---|---|
| | ANNEALING AT 230°C | ANNEALING AT 250°C | ANNEALING AT 270°C | ANNEALING AT 290°C | ANNEALING AT 310°C |
| IrMn 5.0 nm | 15 | 36 | 55 | | |
| IrMn 6.0 nm | -6 | 13 | 34 | 57 | |
| IrMn 7.0 nm | -16 | 0 | 18 | 40 | 60 |
| IrMn 8.3 nm | -32 | -13 | 4 | | |
| IrMn 9.0 nm | -38 | -16 | 0 | | |

*Fig.10*

| | BLOCKING TEMP. Tb (°C) | | | | |
|---|---|---|---|---|---|
| | ANNEALING AT 230°C | ANNEALING AT 250°C | ANNEALING AT 270°C | ANNEALING AT 290°C | ANNEALING AT 310°C |
| IrMn 5.0 nm | 215 | 214 | 215 | | |
| IrMn 6.0 nm | 236 | 237 | 236 | 233 | |
| IrMn 7.0 nm | 246 | 250 | 252 | 250 | 250 |
| IrMn 8.3 nm | 262 | 263 | 266 | | |
| IrMn 9.0 nm | 268 | 266 | 270 | | |

*Fig.11*

| | Ta - Tb (°C) | | | | |
|---|---|---|---|---|---|
| | ANNEALING AT 230°C | ANNEALING AT 250°C | ANNEALING AT 270°C | ANNEALING AT 290°C | ANNEALING AT 310°C |
| IrMn 5.0 nm | 15 | 36 | 55 | | |
| IrMn 6.0 nm | -6 | 13 | 34 | 57 | |
| IrMn 7.0 nm | -16 | 0 | 18 | 40 | 60 |
| IrMn 8.3 nm | -32 | -13 | 4 | | |
| IrMn 9.0 nm | -38 | -16 | 0 | | |

*Fig.12*

| | Hex (Oe) | | | | |
|---|---|---|---|---|---|
| | ANNEALING AT 230°C | ANNEALING AT 250°C | ANNEALING AT 270°C | ANNEALING AT 290°C | ANNEALING AT 310°C |
| IrMn 5.0 nm | 1116 | 1136 | 1116 | | |
| IrMn 6.0 nm | 1104 | 1204 | 1247 | 1231 | |
| IrMn 7.0 nm | 1030 | 1154 | 1237 | 1250 | 1238 |
| IrMn 8.3 nm | 894 | 1063 | 1186 | | |
| IrMn 9.0 nm | 818 | 1010 | 1145 | | |

*Fig.14*

| | BLOCKING TEMP. Tb (°C) | | | |
|---|---|---|---|---|
| | ANNEALING AT 230°C | ANNEALING AT 250°C | ANNEALING AT 270°C | ANNEALING AT 290°C |
| IrMn 6.0 nm | 223 | 220 | 218 | |
| IrMn 6.5 nm | 230 | 232 | 229 | 226 |
| IrMn 7.6 nm | 244 | 248 | 246 | 245 |
| IrMn 8.9 nm | 257 | 260 | 262 | |
| IrMn 10.0 nm | 267 | 266 | 269 | |

Fig.15

| | Ta - Tb (°C) | | | |
|---|---|---|---|---|
| | ANNEALING AT 230°C | ANNEALING AT 250°C | ANNEALING AT 270°C | ANNEALING AT 290°C |
| IrMn 6.0 nm | 7 | 30 | 52 | |
| IrMn 6.5 nm | 0 | 18 | 41 | 64 |
| IrMn 7.6 nm | -14 | 2 | 24 | 45 |
| IrMn 8.9 nm | -27 | -10 | 8 | |
| IrMn 10.0 nm | -37 | -16 | 1 | |

*Fig.16*

| | Hex (Oe) | | | |
|---|---|---|---|---|
| | ANNEALING AT 230°C | ANNEALING AT 250°C | ANNEALING AT 270°C | ANNEALING AT 290°C |
| IrMn 6.0 nm | 1231 | 1356 | 1331 | |
| IrMn 6.5 nm | 1146 | 1336 | 1374 | 1320 |
| IrMn 7.6 nm | 1089 | 1303 | 1387 | 1338 |
| IrMn 8.9 nm | 967 | 1195 | 1340 | |
| IrMn 10.0 nm | 890 | 1117 | 1290 | |

METHODS OF FABRICATING EXCHANGE-COUPLING FILM, MAGNETORESISTIVE ELEMENT, AND THIN-FILM MAGNETIC HEAD

BACKGROUND OF THE INVENTION

1. Field of the Invention

The present invention relates to methods of fabricating an exchange-coupling film, a magnetoresistive element, and a thin-film magnetic head.

2. Related Background Art

As hard disk drives have been increasing their recording density, further improvements in performances have been required in thin-film magnetic heads. As the thin-film magnetic heads, composite thin-film magnetic heads having a structure in which a magnetism detecting element such as magnetoresistive (MR) element and a magnetic recording element such as electromagnetic coil element are laminated have widely been in use. These elements reproduce data signals from a magnetic recording medium and write data signals onto the magnetic recording medium.

A magnetoresistive element provided in a thin-film magnetic head has a structure in which a nonmagnetic layer is held between a pinned magnetic layer whose direction of magnetization is fixed by an exchange-coupling magnetic field applied from an antiferromagnetic layer and a free magnetic layer whose direction of magnetization is not fixed. The direction of magnetization of the free magnetic layer changes according to the orientation of a magnetic flux emitted from a magnetic recording medium, so that the resistance value of the magnetoresistive element varies depending on the relative angle between the pinned magnetic layer and the direction of magnetization of the free magnetic layer. Therefore, when the positions of the thin-film magnetic head and magnetic recording medium are moved relative to each other while a constant current (sense current) is caused to flow through the magnetoresistive element, data signals of the magnetic recording medium can be read as voltage signals, i.e., the data signals can be reproduced by the thin-film magnetic head.

As mentioned above, the pinned magnetic layer has its direction of magnetization fixed by the exchange-coupling magnetic field applied from the antiferromagnetic layer, whereby the antiferromagnetic layer and pinned magnetic layer construct an exchange-coupling film. The direction of magnetization of the pinned magnetic layer is fixed by annealing in a magnetic field. Specifically, while applying an external magnetic field, the exchange-coupling film is heated to a temperature (blocking temperature) at which the exchange-coupling magnetic field applied from the antiferromagnetic layer to the pinned magnetic layer disappears or higher, and then is cooled. From the viewpoint of mass production, it will be more preferred if the maximum temperature during the annealing is lower. Therefore, the maximum temperature in the annealing for fixing the direction of magnetization of the pinned magnetic layer is made substantially the same as the blocking temperature in general.

Meanwhile, the strength of the exchange-coupling magnetic field determining the strength to fix the direction of magnetization of the pinned magnetic layer is an important factor for the reliability of the thin-film magnetic head. Namely, when the exchange-coupling magnetic field applied from the antiferromagnetic layer to the pinned magnetic layer is weak, the direction of magnetization of the pinned magnetic layer may tilt from its initially fixed direction during operations of the thin-film magnetic head. This may cause problems such as reduction in reproduced outputs of the thin-film magnetic head and deterioration in asymmetry of reproduced waveforms.

In conventional methods of fabricating a thin-film magnetic head, however, there have been cases where the exchange-coupling magnetic field is not strong enough to keep the thin-film magnetic head from lowering its reliability.

In view of such problems, it is an object of the present invention to provide methods of fabricating an exchange-coupling film having an exchange-coupling force greater than that conventionally available, and a reliable magnetoresistive element and thin-film magnetic head using such an exchange-coupling film.

SUMMARY OF THE INVENTION

The method of fabricating an exchange-coupling film in accordance with the present invention comprises a multilayer body forming step of forming a multilayer body having an antiferromagnetic layer and a ferromagnetic layer laminated on the antiferromagnetic layer; and an annealing step of annealing the multilayer body in a magnetic field with a maximum temperature higher than a blocking temperature of the multilayer body by 15 to 60° C.

The method of fabricating an exchange-coupling film in accordance with the present invention yields an exchange-coupling film in which an exchange-coupling magnetic field applied from the antiferromagnetic layer to the ferromagnetic layer (pinned magnetic layer) is strong, since the annealing is performed at an appropriate temperature.

The method of fabricating a magnetoresistive element in accordance with the present invention comprises a magnetoresistive element forming step of forming a magnetoresistive element having a multilayer body including an antiferromagnetic layer and a ferromagnetic layer laminated on the antiferromagnetic layer, a nonmagnetic layer laminated on the multilayer body, and a free magnetic layer laminated on the nonmagnetic layer; and an annealing step of annealing the multilayer body in a magnetic field with a maximum temperature higher than a blocking temperature of the multilayer body by 15 to 60° C.

In the method of fabricating a magnetoresistive element in accordance with the present invention, the exchange-coupling magnetic field applied from the antiferromagnetic layer to the ferromagnetic layer (pinned magnetic layer) becomes strong, since the annealing is performed at an appropriate temperature. As a result, a highly reliable magnetoresistive element is obtained.

The method of fabricating a thin-film magnetic head in accordance with the present invention comprises a magnetoresistive element forming step of forming a magnetoresistive element having a multilayer body including an antiferromagnetic layer and a ferromagnetic layer laminated on the antiferromagnetic layer, a nonmagnetic layer laminated on the multilayer body, and a free magnetic layer laminated on the nonmagnetic layer; and an annealing step of annealing the multilayer body in a magnetic field with a maximum temperature higher than a blocking temperature of the multilayer body by 15 to 60° C.

In the method of fabricating a thin-film magnetic head in accordance with the present invention, the exchange-coupling magnetic field applied from the antiferromagnetic layer to the ferromagnetic layer (pinned magnetic layer) becomes strong, since the annealing is performed at an appropriate temperature. As a result, a highly reliable thin-film magnetic head is obtained.

The present invention provides methods of fabricating an exchange-coupling film having an exchange-coupling force greater than that conventionally available, and a reliable magnetoresistive element and thin-film magnetic head using such an exchange-coupling film.

BRIEF DESCRIPTION OF THE DRAWINGS

FIG. 9(*b*) is a chart showing a definition of exchange-coupling magnetic field Hex when measuring an R-H curve;

FIG. 10 is a table showing blocking temperature Tb when changing the thickness of IrMn and annealing temperature Ta in measurement samples;

FIG. 11 is a table showing the value (Ta−Tb) obtained by subtracting the blocking temperature Tb from the annealing temperature Ta when changing the thickness of IrMn and annealing temperature Ta in the measurement samples;

FIG. 12 is a table showing the value of Hex when changing the thickness of IrMn and annealing temperature Ta in the measurement samples;

FIG. 14 is a table showing the blocking temperature Tb when changing the thickness of IrMn and annealing temperature Ta in measurement samples;

FIG. 15 is a table showing the value (Ta−Tb) obtained by subtracting the blocking temperature Tb from the annealing temperature Ta when changing the thickness of IrMn and annealing temperature Ta in the measurement samples;

FIG. 16 is a table showing the value of Hex when changing the thickness of IrMn and annealing temperature Ta in the measurement samples.

DESCRIPTION OF THE PREFERRED EMBODIMENTS

Figure 1:
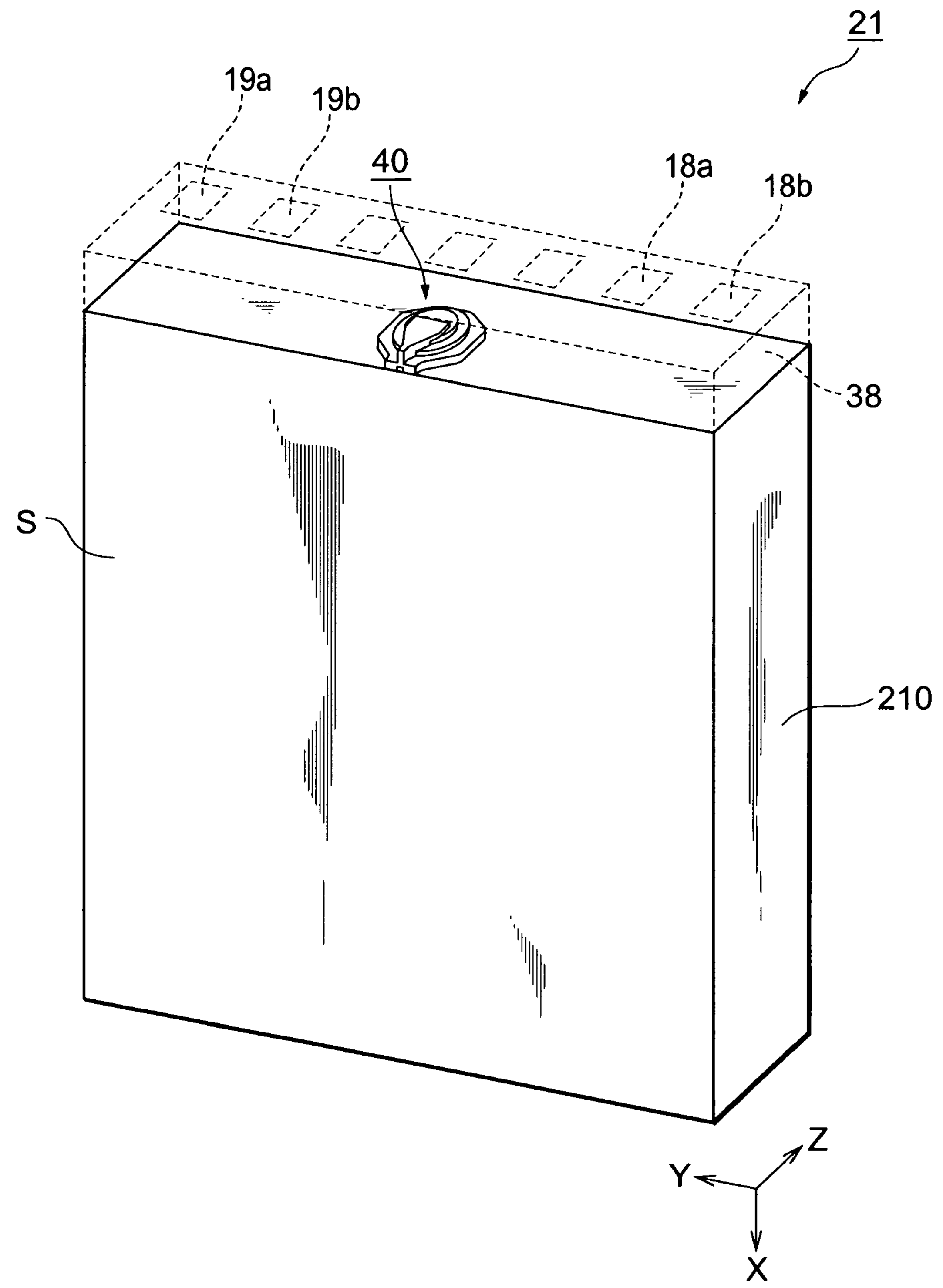
FIG. 1 is an enlarged perspective view of the magnetic head in accordance with an embodiment.

In the following, modes for carrying out the present invention will be explained in detail with reference to the accompanying drawings. In each drawing, the same elements are denoted by the same reference numbers. The ratios of dimensions in and among constituents in the drawings are arbitrary for the convenience of viewing the drawings.

First, an exchange-coupling film, a magnetoresistive element, and a thin-film magnetic head which are obtained by methods of fabricating them in accordance with embodiments of the present invention will be explained.

FIG. 1 is an enlarged perspective view of the thin-film magnetic head in accordance with an embodiment. This thin-film magnetic head 21 is one in which a magnetic head part 40 is formed on a side face of a slider substrate 210 shaped like a substantially rectangular parallelepiped mainly composed of AlTiC ($Al_2O_3$.TiC). The surface on the front side in the drawing is a medium-opposing surface S facing a recording surface of a magnetic recording medium 10 (see FIG. 2). When the magnetic recording medium 10 rotates, airflows accompanying the rotation levitate the thin-film magnetic head 21, thereby separating the medium-opposing surface S from the recording surface of the magnetic recording medium 10. The thin-film magnetic head 21 is provided with an insulating layer 38 as an overcoat layer illustrated by broken lines. Recording pads 18*a*, 18*b* and reproducing pads 19*a*, 19*b* are attached onto the insulating layer 38. The medium-opposing surface S may be coated with DLC (Diamond-Like Carbon) or the like.

Figure 2:
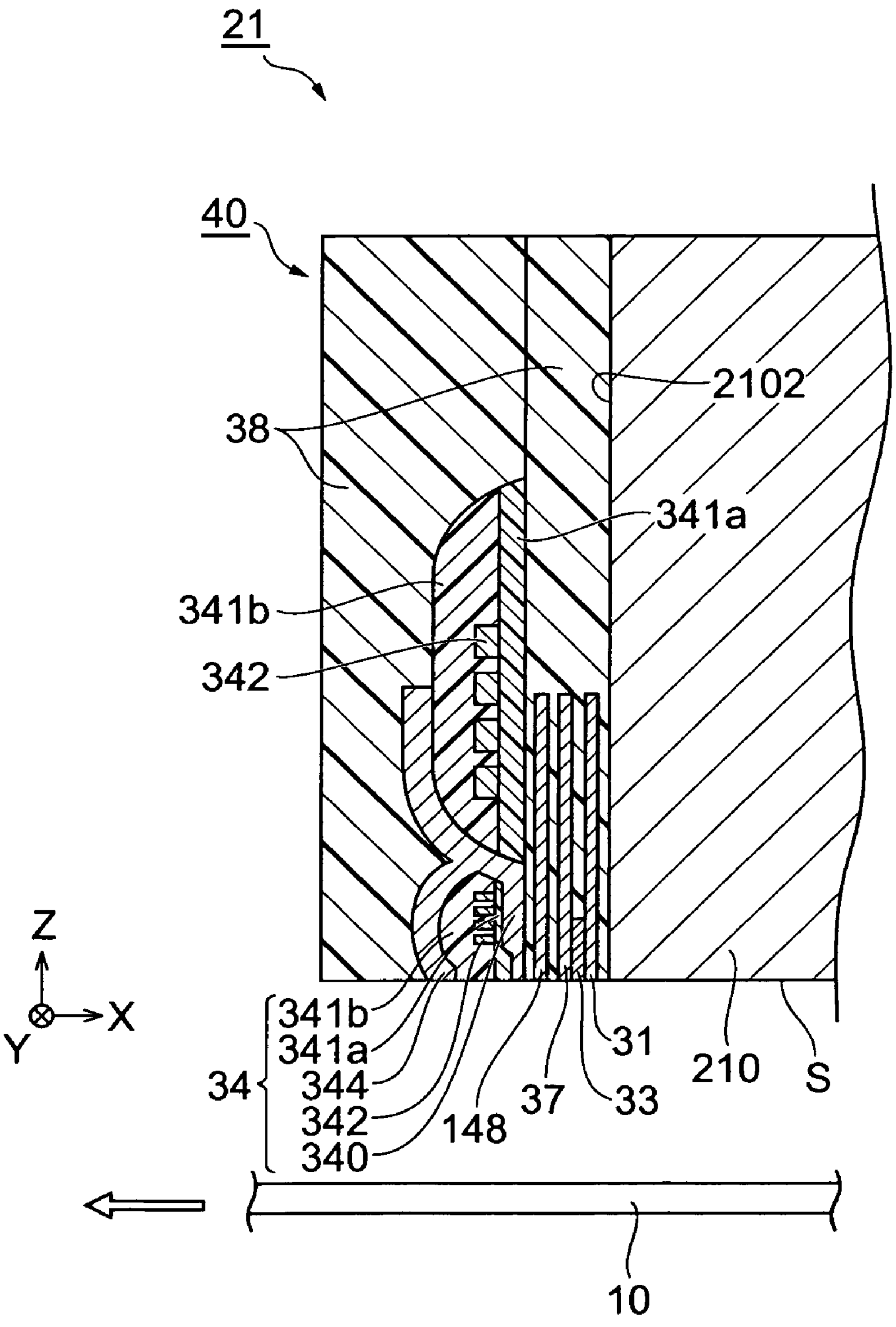
FIG. 2 is a sectional view of the magnetic head in accordance with the embodiment taken along a direction perpendicular to a medium-opposing surface S.

FIG. 2 is a sectional view taken along a direction perpendicular to the medium-opposing surface S of the thin-film magnetic head 21 shown in FIG. 1 and schematically illustrates how it opposes the magnetic recording medium 10.

As shown in FIG. 2, the thin-film magnetic head 21 comprises the slider substrate 210 and the magnetic head part 40 laminated on a laminating surface 2102 of the slider substrate 210.

The magnetic head part 40 includes a magnetoresistive element layer 33 as a magnetism detecting film arranged between a lower magnetic shield layer 31 and an upper magnetic shield layer 37, and an electromagnetic coil element 34 as a magnetic recording element.

The lower magnetic shield layer 31 and upper magnetic shield layer 37 are planar layers extending from the medium-opposing surface S in the height direction (direction perpendicular to the medium-opposing surface S, i.e., direction along the Z axis in FIG. 2) so as to become, substantially parallel to the laminating surface 2102 of the slider substrate 210, while the lower magnetic shield layer 31 is closer to the slider substrate 210 than is the upper magnetic shield layer 37. The lower magnetic shield layer 31 and upper magnetic shield layer 37 form part of the medium-opposing surface S. The magnetoresistive element layer 33 is formed such as to be held between the lower magnetic shield layer 31 and upper magnetic shield layer 37, and extends in the height direction from the medium-opposing surface S.

Each of the lower magnetic shield layer 31 and upper magnetic shield layer 37 can be constituted by a magnetic material such as NiFe, CoFeNi, CoFe, FeN, or FeZrN having a thickness on the order of 0.5 to 3 μm formed by a pattern plating method including frame plating, for example. The lower magnetic shield layer 31 and upper magnetic shield layer 37 prevent the magnetoresistive element layer 33 from being affected by external magnetic fields which cause noises.

For example, the magnetoresistive element layer 33 is a current-perpendicular-to-plane (CPP) multilayer film in which a sense current flows in a direction perpendicular to its laminating surface (direction along the X axis in FIG. 2), and for which a tunneling magnetoresistive (TMR) film or CPP giant magnetoresistive (GMR) film can favorably be used. When such a magnetoresistive film is used as the magnetoresistive element layer 33, signal magnetic fields from magnetic disks can be sensed with a very high sensitivity. When a CPP multilayer film is used as the magnetoresistive element layer 33, the upper and lower magnetic shield layers 37, 31 also function as upper and lower electrode layers for supplying a sense current to the MR element layer 33, respectively. Namely, the upper and lower magnetic shield layers 37, 31 are electrically connected to the reproducing pads 19*a*, 19*b* (see FIG. 1), respectively, and a sense current is supplied to the magnetoresistive element 33 when a voltage is applied between the reproducing pads 19*a*, 19*b*.

As shown in FIG. 2, an interelement magnetic shield layer 148 made of a material similar to that of the upper magnetic shield layer 37 is formed between the upper magnetic shield layer 37 and electromagnetic coil element 34. The interelement magnetic shield layer 148 acts to shield the magnetoresistive element layer 33 from magnetic fields generated by the electromagnetic coil element 34 and prevent external noises from occurring at the time of reading. A backing coil part may further be formed between the interelement magnetic shield layer 148 and electromagnetic coil element 34. The backing coil part generates a magnetic flux which cancels a magnetic flux loop traveling the upper and lower electrode layers of the magnetoresistive element layer 33 after being caused by the electromagnetic coil element 34, and suppresses the phenomenon of wide adjacent track erasure (WATE) which is an unnecessary writing or erasing action for a magnetic disk.

The insulating layer 38 made of alumina or the like is formed between the upper and lower magnetic shield layers 37, 31 on the side of the magnetoresistive element layer 33 opposite from the medium-opposing surface S, on the upper and lower magnetic shield layers 37, 31, on the interelement magnetic shield layer 148 on the side opposite from the medium-opposing surface S, between the lower magnetic shield layer 31 and slider substrate 210, between the upper magnetic shield layer 37 and interelement shield layer 148, and between the interelement shield layer 148 and electromagnetic coil element 34.

A current-in-plane (CIP) multilayer film can also be used as the magnetoresistive element layer 33. In this case, the insulating layer 38 is also provided between each of the upper and lower magnetic shield layers 37, 31 and the magnetoresistive element layer 33. Though not depicted, an MR lead conductor layer for supplying a sense current to the magnetoresistive element layer 33 and taking out a reproduced output is also formed in this case.

The electromagnetic coil element 34 is preferably one for perpendicular magnetic recording, and comprises a main magnetic pole layer 340, a gap layer 341*a*, a coil insulating layer 341*b*, a coil layer 342, and an auxiliary magnetic pole layer 344 as shown in FIG. 2.

The main magnetic pole layer 340 is a magnetism guiding path for guiding a magnetic flux induced by the coil layer 342 to a recording layer of the magnetic recording medium 10 where writing is made, while converging the magnetic flux. Here, it will be preferred if the end part of the main magnetic pole layer 340 on the medium-opposing surface S side has a width in the track width direction (direction along the Y axis in FIG. 2) and a thickness in the laminating length direction (direction along the X axis in FIG. 2) which are smaller than those in the remaining part. This makes it possible to generate fine, strong writing magnetic fields adapted to a high recording density.

The end part on the medium-opposing surface S side of the auxiliary magnetic pole layer 344 magnetically coupled to the main magnetic pole layer 340 forms a trailing shield part having a layer cross section wider than that of the remaining part of the auxiliary magnetic pole layer 344. The auxiliary magnetic pole part 344 opposes the end part of the main magnetic pole layer 340 on the medium-opposing surface S side through the gap layer 341*a* and coil insulating layer 341*b* formed by insulating materials such as alumina. Providing such an auxiliary magnetic pole layer 344 makes the magnetic field gradient steeper between the auxiliary magnetic layer 344 and main magnetic pole layer 340 in the vicinity of the medium-opposing surface S. As a result, jitter becomes smaller in signal outputs, whereby the error rate at the time of reading can be lowered.

The auxiliary magnetic pole layer 344 is constituted by an alloy having a thickness of about 0.5 to about 5 μm made of two or three of Ni, Fe, and Co formed by frame plating, sputtering, or the like, an alloy mainly composed of them and doped with a predetermined element, or the like, for example.

The gap layer 341*a* separates the coil layer 342 and main magnetic layer 340 from each other, and is constituted by $Al_2O_3$, DLC, or the like having a thickness of about 0.01 to about 0.5 μm formed by using sputtering, CVD, or the like, for example.

The coil layer 342 is constituted by Cu or the like having a thickness of about 0.5 to about 3 μm formed by using frame plating or the like, for example. The rear end of the main magnetic pole layer 340 and the part of the auxiliary magnetic pole layer 344 remote from the medium-opposing surface S are joined to each other, while the coil layer 342 is formed so as to surround their joint. The coil layer 342 is electrically connected to the recording pads 18*a*, 18*b* (see FIG. 1). When a voltage is applied between the recording pads 18*a*, 18*b*, a current flows through the coil layer 342, and a writing magnetic flux is pumped with this current.

The coil insulating layer 341*b* separates the coil layer 342 and auxiliary magnetic pole layer 344 from each other, and is constituted by an electrically insulating material such as a thermally cured resist or alumina layer having a thickness of about 0.1 to about 5 μm, for example.

On the side of the electromagnetic coil element 34 opposite from the slider substrate 210, the insulating layer 38 as an overcoat layer is formed such as to cover the electromagnetic coil element 34.

Figure 3:
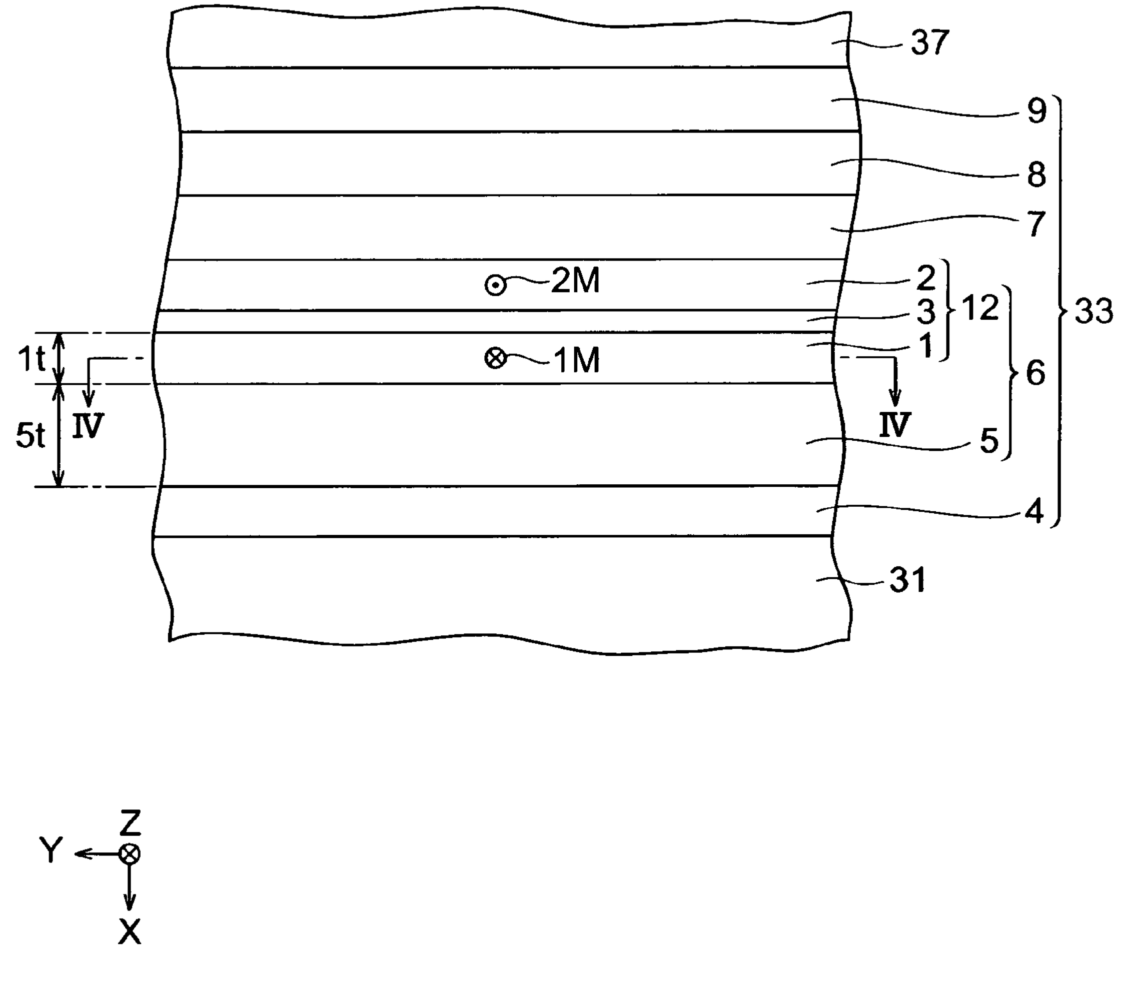
FIG. 3 is a plan view of a thin-film magnetic head 21 in the vicinity of a magnetoresistive element 33 as seen from the medium-opposing surface S side.
Figure 4:
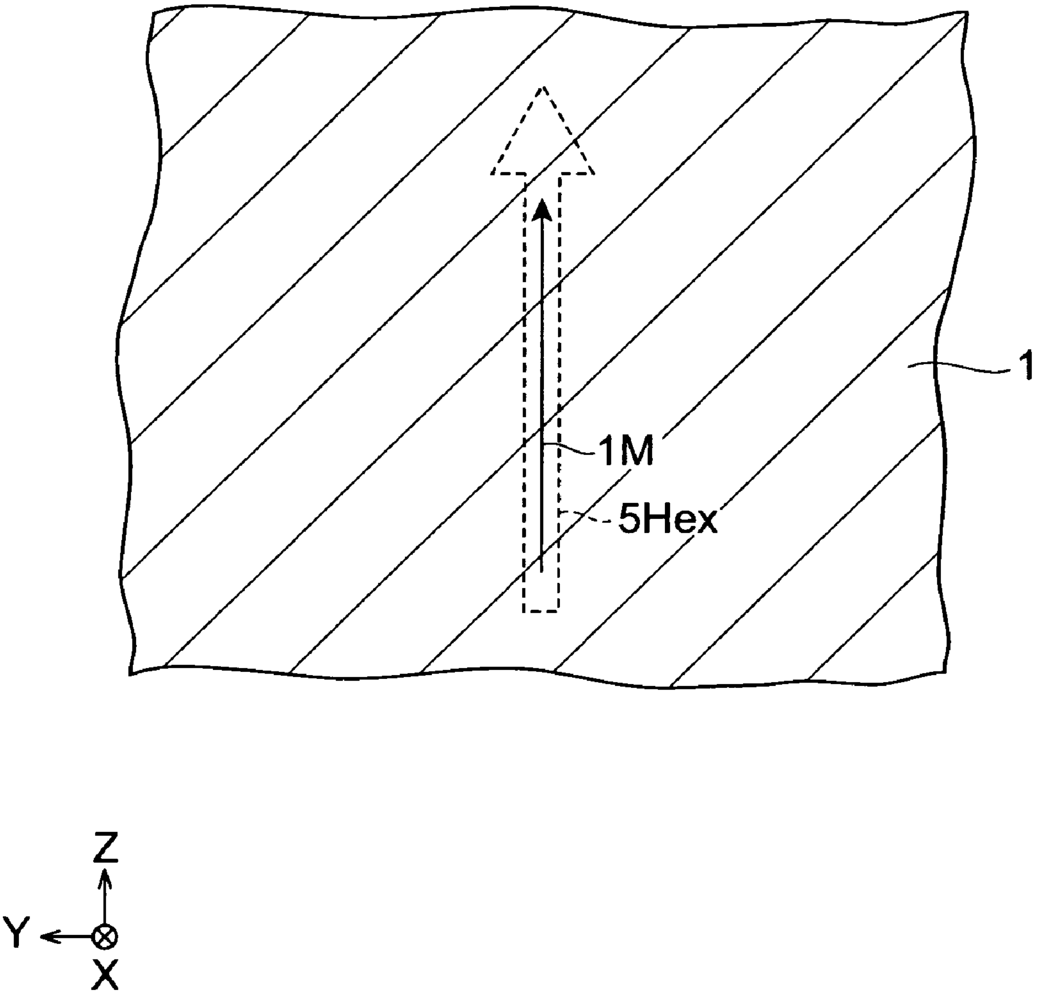
FIG. 4 is a sectional view of the magnetoresistive element 33 taken along the line IV-IV of FIG. 3.

The structure of the magnetoresistive element 33 will now be explained in detail. FIG. 3 is a plan view of the thin-film magnetic head 21 in the vicinity of the magnetoresistive element 33 as seen from the medium-opposing surface S side, while FIG. 4 is a sectional view of the magnetoresistive element 33 taken along the line IV-IV of FIG. 3.

As shown in FIG. 3, the magnetoresistive element 33 provided between the lower magnetic shield layer 31 and upper magnetic shield layer 37 has a foundation layer 4, an antiferromagnetic layer 5 laminated on the foundation layer 4, a first pinned magnetic layer 1 (ferromagnetic layer) laminated on the antiferromagnetic layer 5, a middle layer 3 laminated on the first pinned magnetic layer 1, a second pinned magnetic layer 2 laminated on the middle layer 3, a nonmagnetic layer 7 laminated on the second pinned magnetic layer 2, a free magnetic layer 8 laminated on the nonmagnetic layer 7, and a protective layer 9 laminated on the free magnetic layer 8. The first pinned magnetic layer 1, middle layer 3, and second pinned magnetic layer 2 constitute a pinned magnetic layer 12 of the magnetoresistive element 33. The antiferromagnetic layer 5 and pinned magnetic layer 12 form an exchange-coupling film 6 in accordance with this embodiment. These layers are formed by sputtering or the like.

The foundation layer 4 is provided in order to improve the crystallinity of the antiferromagnetic layer 5, and so forth. The foundation layer 4 may have a one-layer structure made of Ta, NiCr, or the like, or a two-layer structure made of Ta/Ru, Ta/NiFe, Ta/Hf, or the like. The magnetoresistive element 33 may omit the foundation layer 4.

When a TMR element is used as the magnetoresistive element 33, it has a structure in which an antiferromagnetic layer 5 made of IrMn, PtMn, NiMn, RuRhMn; or the like having a thickness St of 5 to 15 nm, for example; a first pinned magnetic layer 1 made of a ferromagnetic layer such as CoFe having a thickness 1*t* of 1 to 10 nm, for example; a middle layer 3 made of a nonmagnetic layer such as Ru; a second pinned magnetic layer 2 made of a ferromagnetic layer such as CoFe; a tunnel barrier layer 7 made of a nonmagnetic dielectric material obtained by oxidizing a metal film having a thickness on the order of 0.5 to 1 nm made of Al, AlCu, Mg, or the like with oxygen introduced into a vacuum apparatus or naturally, for example; a free magnetic layer 8 which forms a tunnel junction with the second pinned magnetic layer 2 through the tunnel barrier layer 7 and is constituted by a two-layer film composed of CoFe or the like having a thickness on the order of 1 nm and NiFe or the like having a thickness on the order of 3 to 4 nm, which are ferromagnetic materials, for example; and a protective layer 9 made of Ru, Ta, or the like having a thickness on the order of 1 to 5 nm are successively laminated on the foundation layer 4. The magnetoresistive element 33 may omit the protective layer 9.

As shown in FIG. 4, the direction of magnetization 1M of the first pinned magnetic layer 1 is fixed to the positive direction of Z axis by an exchange-coupling magnetic field 5Hex applied from the antiferromagnetic layer 5. As shown in FIG. 3, the direction of magnetization 2M of the second pinned magnetic layer 2 is fixed to a direction (negative direction of Z axis) which is opposite and parallel to the direction of magnetization 1M through the middle layer 3.

When a CPP GMR film is used as the magnetoresistive element 33, it has a structure in which the tunnel barrier layer 7 in the above-mentioned TMR film is replaced with a nonmagnetic conductive layer made of Cu or the like having a thickness on the order of 1 to 3 nm.

With reference to FIGS. 5 to 8, methods of fabricating an exchange-coupling film, a magnetoresistive element, and a thin-film magnetic head in accordance with embodiments of the present invention will be explained. FIGS. 5 to 8 are sectional views of intermediates of the thin-film magnetic head in accordance with the embodiment.

Figure 5:
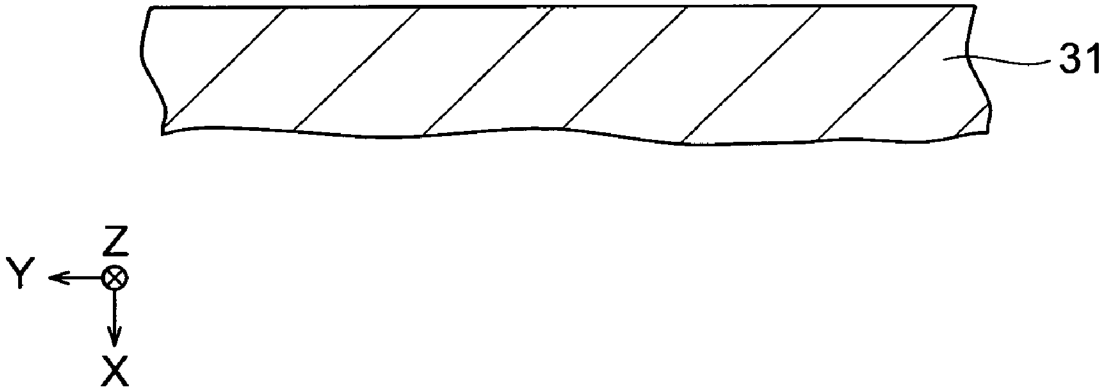
FIG. 5 is a sectional view of an intermediate of the thin-film magnetic head in accordance with the embodiment.

First, as shown in FIG. 5, the lower magnetic shield layer 31 is formed on the insulating layer 38 (see FIG. 2) formed on the laminating surface 2102 of the slider substrate 210.

Figure 6:
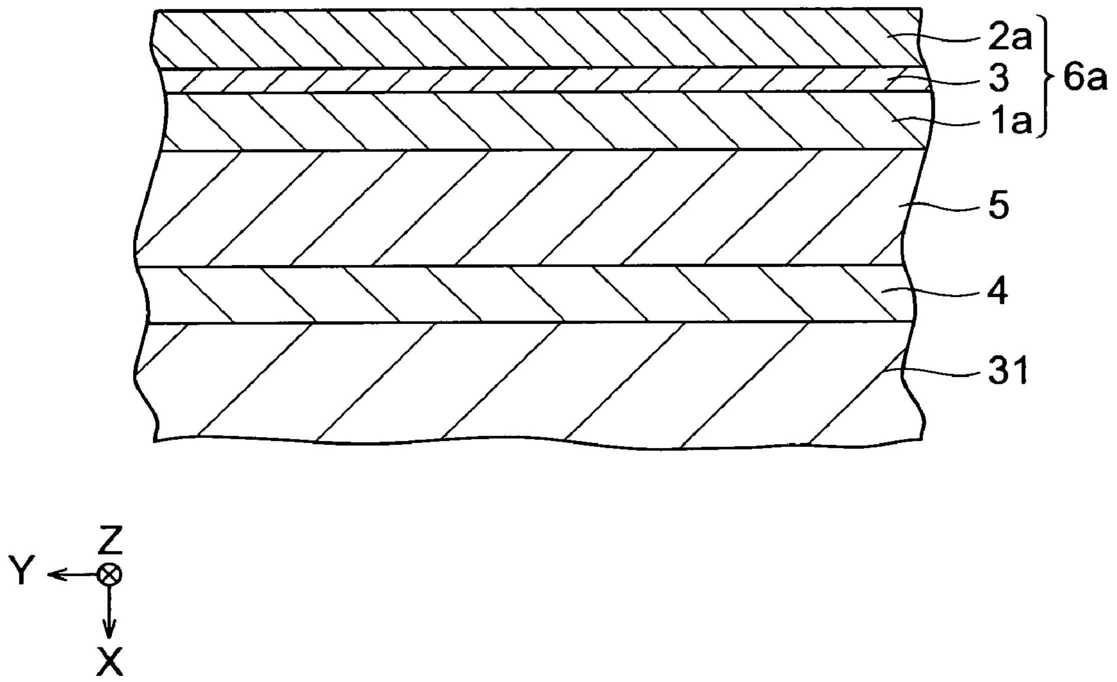
FIG. 6 is a sectional view of an intermediate of the thin-film magnetic head in accordance with the embodiment.

Then, as shown in FIG. 6, the foundation layer 4 is formed on the lower magnetic shield layer 31, and a multilayer body 6*a* constituted by the antiferromagnetic layer 5, a first pinned layer 1*a* (magnetic layer), the middle layer 3, and a second pinned layer 2*a* is formed on the foundation layer 4.

Figure 7:
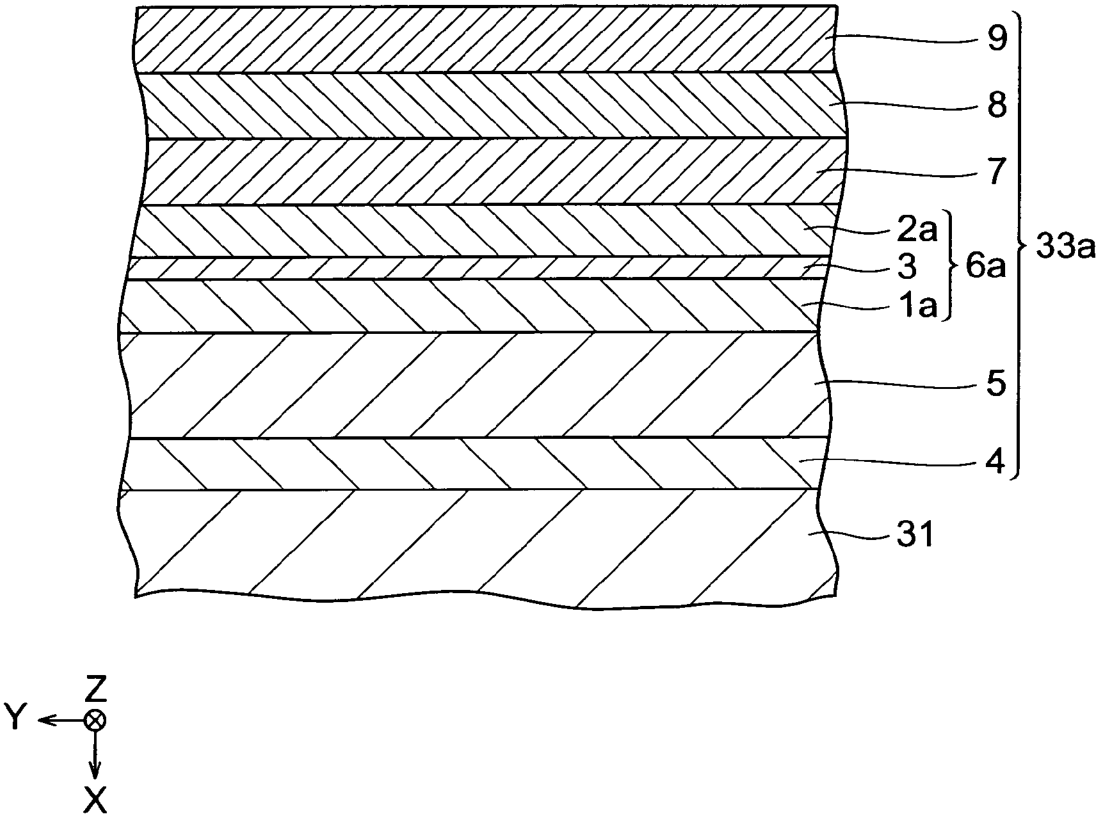
FIG. 7 is a sectional view of an intermediate of the thin-film magnetic head in accordance with the embodiment.

Next, as shown in FIG. 7, the nonmagnetic layer 7, the free magnetic layer 8, and the protective layer 9 are successively formed on the multilayer body 6*a*. This forms a magnetoresistive element intermediate 33*a*.

Figure 8:
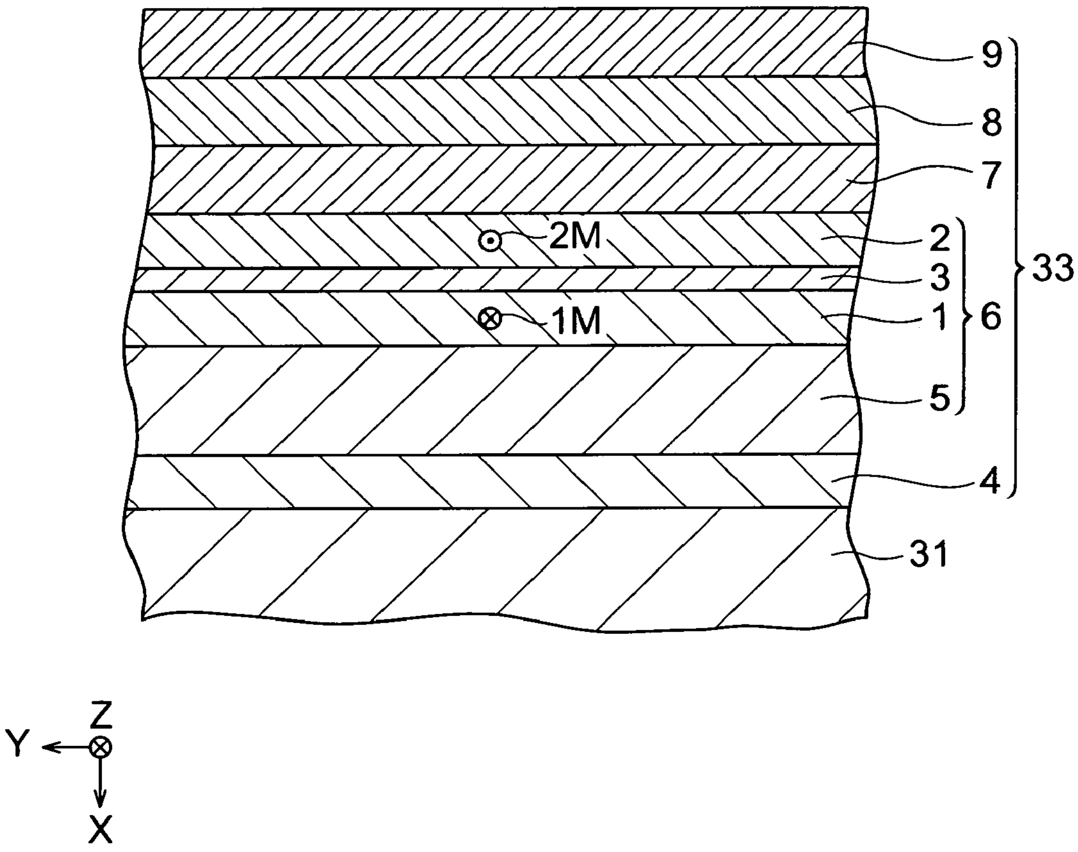
FIG. 8 is a sectional view of an intermediate of the thin-film magnetic head in accordance with the embodiment.

Subsequently, while a magnetic field of 2 kOe to 10 kOe, for example, is applied to the positive direction of Z axis in FIG. 7, annealing, i.e., heating to a predetermined temperature and then cooling to about room temperature, is performed. The predetermined temperature, i.e., maximum temperature, in the annealing is higher than the blocking temperature of the multilayer body 6*a* by 15 to 60° C., preferably by 20 to 40° C. Consequently, as shown in FIG. 8, the direction of magnetization 1M of the first pinned magnetic layer 1 and the direction of magnetization 2M of the second pinned magnetic layer 2 are fixed to the positive and negative directions of Z axis, respectively. This completes the exchange-coupling film 6 and the magnetoresistive element 33 having the exchange-coupling film 6.

Thereafter, the upper magnetic shield layer 37, insulating layer 38, interelement magnetic shield layer 148, electromagnetic coil element 34, and the like are formed by known methods (see FIG. 2). Then, steps of lapping for defining the medium-opposing surface S, cutting individual magnetic heads 21 on the slider substrate 210, and the like are carried out, whereby the magnetic head 21 is completed.

Since the annealing is performed at an appropriate temperature, i.e., such that the maximum temperature is higher than the blocking temperature of the multilayer body 6*a* by 15 to 60° C., preferably by 20 to 40° C., the method of fabricating an exchange-coupling film in accordance with the above-mentioned embodiment yields the exchange-coupling film 6 in which the exchange-coupling magnetic field 5Hex applied from the antiferromagnetic layer 5 to the pinned magnetic layer 1 is strong (see FIGS. 4, 7, and 8).

Since the annealing is performed at an appropriate temperature, i.e., such that the maximum temperature is higher than the blocking temperature of the multilayer body 6*a* by 15 to 60° C., preferably by 20 to 40° C., the exchange-coupling magnetic field 5Hex applied from the antiferromagnetic layer 5 to the pinned magnetic layer 1 becomes strong (see FIGS. 4, 7, and 8) in the method of fabricating a magnetoresistive element in accordance with the embodiment. As a result, the magnetoresistive element 33 having a high reliability is obtained.

Since the annealing is performed at an appropriate temperature, i.e., such that the maximum temperature is higher than the blocking temperature of the multilayer body 6*a* by 15 to 60° C., preferably by 20 to 40° C., the exchange-coupling magnetic field 5Hex applied from the antiferromagnetic layer 5 to the pinned magnetic layer 1 becomes strong (see FIGS. 4, 7, and 8) in the method of fabricating a thin-film magnetic head in accordance with the embodiment. As a result, the thin-film magnetic head 21 having a high reliability is obtained (see FIG. 2).

Results of experiments conducted for further clarifying effects of the present invention will now be explained.

In the experiments set forth in the following, for measurement samples having various film structures, changes in the magnitude of exchange-coupling magnetic field Hex occurring when altering the blocking temperature of their multilayer bodies and the maximum temperature in annealing were investigated. First, methods of measuring the exchange-coupling magnetic field Hex will be explained.

Figure 9:
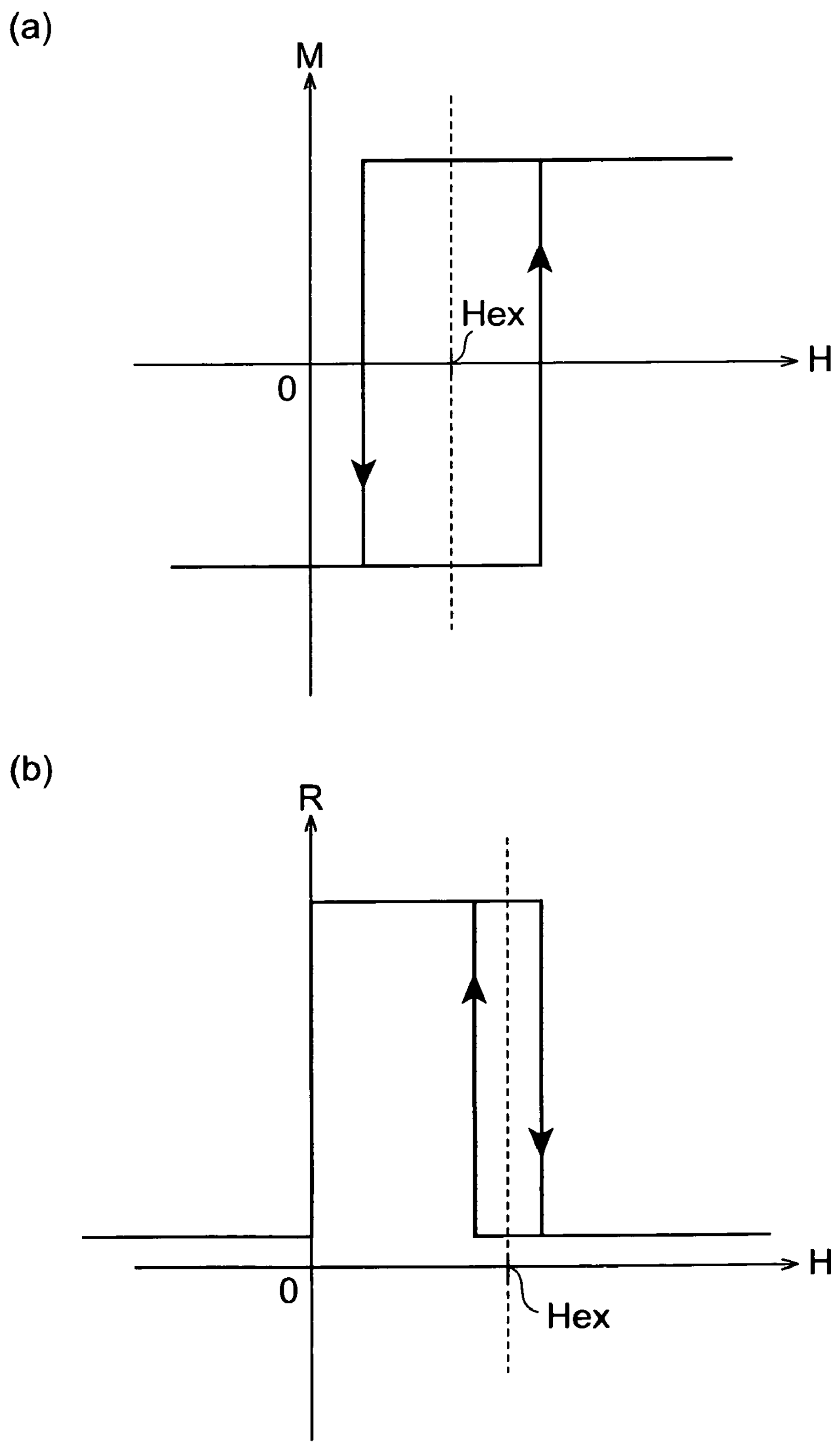
FIG. 9(*a*) is a chart showing a definition of exchange-coupling magnetic field Hex when measuring an M-H curve.

There are mainly two methods for measuring the exchange-coupling magnetic field Hex. The first method prepares a measurement sample by successively laminating a foundation layer and a multilayer body (composed of an antiferromagnetic layer and a first pinned magnetic layer (ferromagnetic layer)), and determines the dependence of magnetization M on the external magnetic field H as shown in FIG. 9(*a*) with a VSM (Vibrating Sample Magnetometer), for example. The value of external magnetic field H corresponding to the center of the hysteresis part of this M-H curve is the exchange-coupling magnetic field Hex.

The second method prepares a measurement sample (GMR multilayer film) by successively laminating a foundation layer, a multilayer body (composed of an antiferromagnetic layer and a first pinned magnetic layer (ferromagnetic layer)), a nonmagnetic layer, a free magnetic layer (ferromagnetic layer), and a cap layer (protective layer). The cap layer (protective layer) is a layer formed by a material such as Ta or Ru, and is provided for preventing materials constituting the free magnetic layer from diffusing and oxidizing, protecting lower layers at the time of milling in later steps, and so forth. By measuring the resistance value of the sample by the four-terminal method or the like, the dependence of the resistance value R on the external magnetic field H as shown in FIG. 9(*b*) is determined. The value of external magnetic field H corresponding to the center of the hysteresis part of this R—H curve is the exchange-coupling magnetic field Hex.

The blocking temperature of the multilayer body can be determined as a temperature at which the value of Hex becomes 0, while raising the measuring temperature of Hex.

FIG. 10 is a table showing the blocking temperature Tb when changing the thickness of IrMn and annealing temperature Ta in measurement samples having a structure of Ta (1 nm)/Ru (2 nm)/IrMn (5.0, 6.0, 7.0, 8.3, and 9.0 nm)/CoFe (3 nm)/Cu (2 nm)/CoFe (1 nm)/NiFe (3 nm)/Ru (1 nm)/Ta (3 nm). As can be seen from FIG. 10, it has been found that the blocking temperature Tb depends on the thickness of the antiferromagnetic layer but not substantially on the annealing temperature Ta.

FIG. 11 is a table showing the value (Ta−Tb) obtained by subtracting the blocking temperature Tb from the annealing temperature Ta in the same measurement samples as those of FIG. 10. FIG. 12 is a table showing the value of Hex in the same measurement samples as those of FIG. 10.

Figure 13:
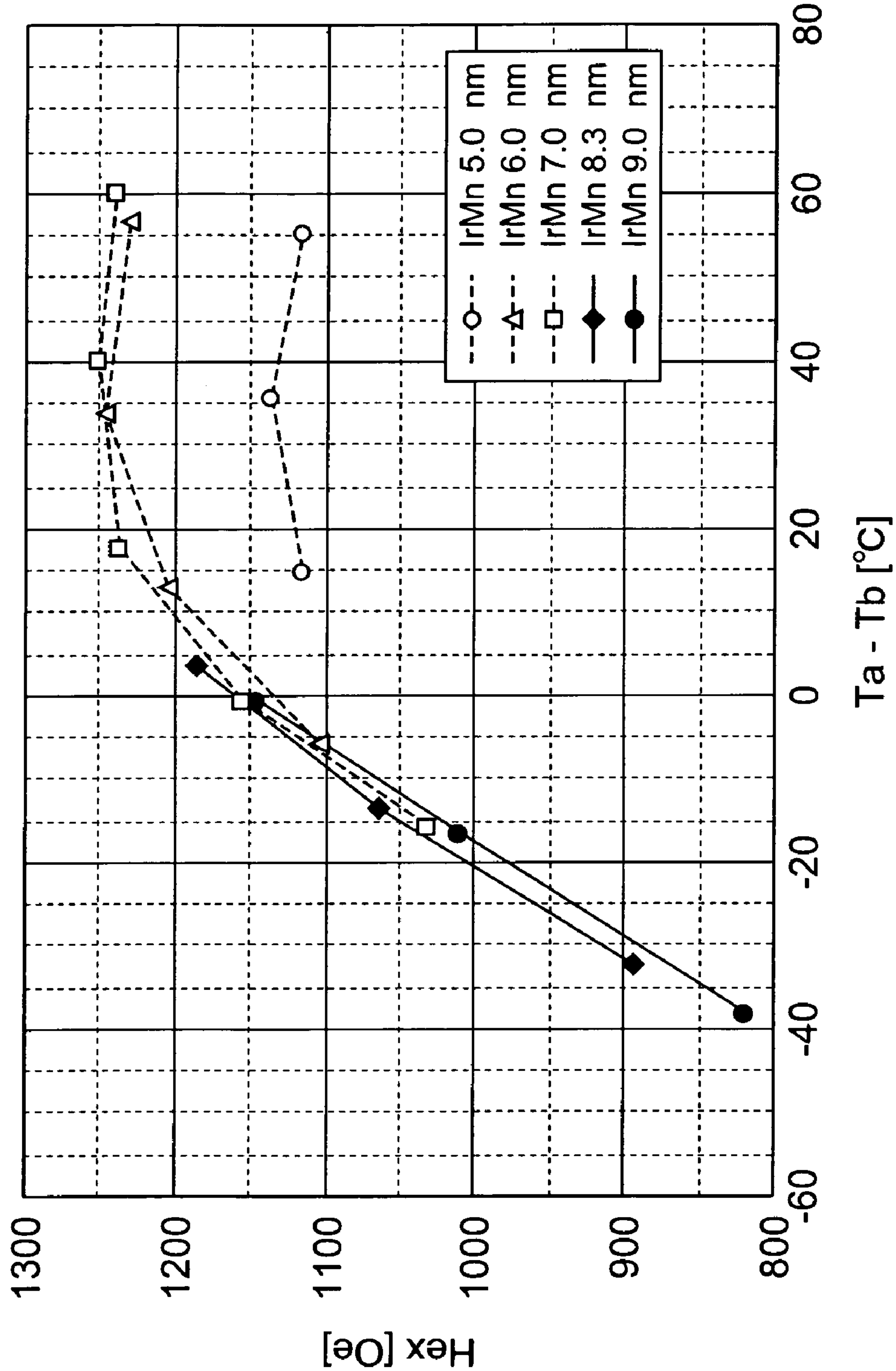
FIG. 13 is a graph showing the dependence of Hex on the value (Ta−Tb) obtained by subtracting the blocking temperature Tb from the annealing temperature Ta.

FIG. 13 is a graph whose ordinate and abscissa indicate the value of Hex in FIG. 12 and the value of (Ta−Tb) in FIG. 11, respectively. As can be seen from FIG. 13, the value of Hex obtained by annealing at a temperature higher than the blocking temperature Tb by 15 to 60° C. was greater than that obtained by annealing at the blocking temperature Tb. The value of Hex became greater in particular when the annealing was performed at a temperature higher than the blocking temperature Tb by 20 to 40° C.

FIGS. 14 to 17, which correspond to FIGS. 10 to 13, respectively, show results concerning measurement samples having a structure different from that of FIG. 10. Specifically, FIG. 14 is a table showing the blocking temperature Tb when changing the thickness of IrMn and annealing temperature Ta in measurement samples having a structure of Ta (1 nm)/Hf (2 nm)/NiFe (2 nm)/IrMn (6.0, 6.5, 7.6, 8.9, and 10.0 nm)/CoFe (3 nm)/Cu (2 nm)/CoFe (1 nm)/NiFe (3 nm)/Ru (1 nm)/Ta (3 nm). As can be seen from FIG. 14, it has been found that the blocking temperature Tb depends on the thickness of the antiferromagnetic layer but not substantially on the annealing temperature Ta.

FIG. 15 is a table showing the value (Ta−Tb) obtained by subtracting the blocking temperature Tb from the annealing temperature Ta in the same measurement samples as those of FIG. 14. FIG. 16 is a table showing the value of Hex in the same measurement samples as those of FIG. 14.

Figure 17:
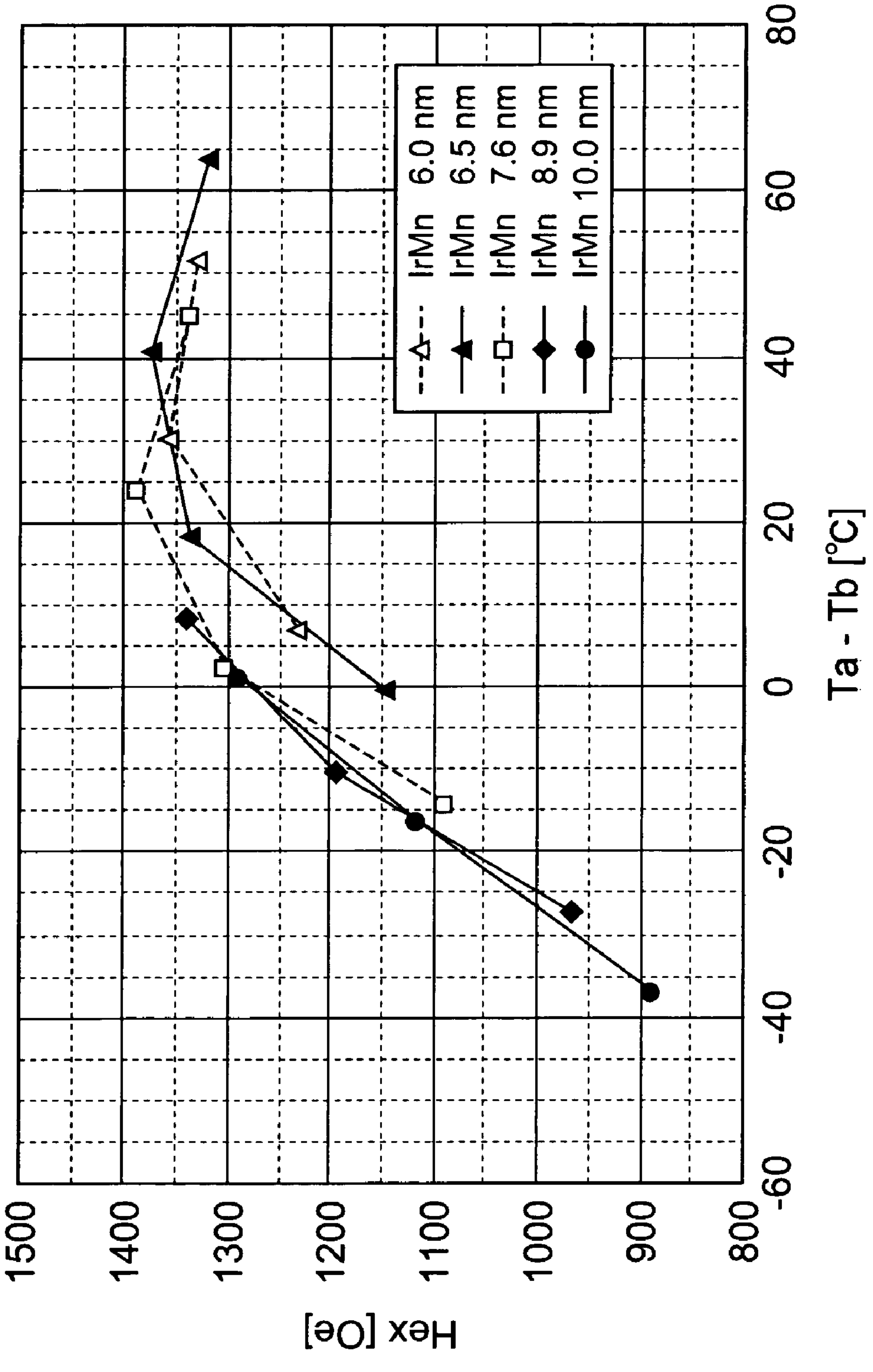
FIG. 17 is a graph showing the dependence of Hex on the value (Ta−Tb) obtained by subtracting the blocking temperature Tb from the annealing temperature Ta.

FIG. 17 is a graph whose ordinate and abscissa indicate the value of Hex in FIG. 16 and the value of (Ta−Tb) in FIG. 15, respectively. As can be seen from FIG. 17, the value of Hex obtained by annealing at a temperature higher than the blocking temperature Tb by 15 to 60° C. was greater than that obtained by annealing at the blocking temperature Tb. The value of Hex became greater in particular when the annealing was performed at a temperature higher than the blocking temperature Tb by 20 to 40° C.

The present invention can be modified in various ways without being restricted to the above-mentioned embodiments and examples.

For example, the pinned magnetic layer 12 of the exchange-coupling film 6 and magnetoresistive element 33 may omit the middle layer 3 and second pinned magnetic layer 2 (see FIG. 3). Namely, the pinned magnetic layer 12 of the exchange-coupling film 6 and magnetoresistive element 33 may be constituted by the first pinned magnetic layer 1 alone.

The magnetic head part 40 of the thin-film magnetic head 21 is not required to have both of the magnetoresistive element 33 and electromagnetic coil element 34, but may have the magnetoresistive element 33 alone.

The exchange-coupling film and magnetoresistive element in accordance with the present invention can be used not only in thin-film magnetic heads, but also in MRAM (magnetoresistive random access memory) and magnetic sensors.

What is claimed is:

1. A method of fabricating an exchange-coupling film, the method comprising:

a multilayer body forming step of forming a multilayer body having an antiferromagnetic layer and a ferromagnetic layer laminated on the antiferromagnetic layer; and an annealing step of annealing the multilayer body in a magnetic field with a temperature that reaches a maximum temperature Tmax for the annealing, the maximum temperature Tmax being within a range of Tb+15° C.≦Tmax≦Tb+60° C., where Tb is a blocking temperature of the multilayer body.

2. A method of fabricating a magnetoresistive element, the method comprising:

a magnetoresistive element forming step of forming a magnetoresistive element having a multilayer body including an antiferromagnetic layer and a ferromagnetic layer laminated on the antiferromagnetic layer, a nonmagnetic layer laminated on the multilayer body, and a free magnetic layer laminated on the nonmagnetic layer; and an annealing step of annealing the multilayer body in a magnetic field with a temperature that reaches a maximum temperature Tmax for the annealing, the maximum temperature Tmax being within a range of Tb+15° C.≦Tmax≦Tb+60° C., where Tb is a blocking temperature of the multilayer body.

3. A method of fabricating a thin-film magnetic head, the method comprising:

a magnetoresistive element forming step of forming a magnetoresistive element having a multilayer body including an antiferromagnetic layer and a ferromagnetic layer laminated on the antiferromagnetic layer, a nonmagnetic layer laminated on the multilayer body, and a free magnetic layer laminated on the nonmagnetic layer; and an annealing step of annealing the multilayer body in a magnetic field with a temperature that reaches a maximum temperature Tmax for the annealing, the maximum temperature Tmax being within a range of Tb+15° C.≦Tmax≦Tb+60°C., where Tb is a blocking temperature of the multilayer body.

* * * * *